(12) United States Patent
Kim et al.

(10) Patent No.: US 10,498,363 B2
(45) Date of Patent: Dec. 3, 2019

(54) LOW DENSITY PARITY CHECK DECODER USING BINARY LOGARITHM AND DECODING METHOD THEREOF

(71) Applicant: Electronics and Telecommunications Research Institute, Daejeon (KR)

(72) Inventors: Hyuk Kim, Daejeon (KR); Insan Jeon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 120 days.

(21) Appl. No.: 15/803,073

(22) Filed: Nov. 3, 2017

(65) Prior Publication Data

US 2018/0358983 A1 Dec. 13, 2018

(30) Foreign Application Priority Data

Jun. 7, 2017 (KR) .......................... 10-2017-0070950

(51) Int. Cl.
*H03M 13/11* (2006.01)
*G06F 17/13* (2006.01)

(52) U.S. Cl.
CPC ...... *H03M 13/1125* (2013.01); *H03M 13/112* (2013.01); *H03M 13/1108* (2013.01);
(Continued)

(58) Field of Classification Search
CPC ......... H03M 13/1125; H03M 13/1108; H03M 13/1134; H03M 13/114; G06F 17/13
See application file for complete search history.

(56) References Cited

U.S. PATENT DOCUMENTS 7,178,081 B2   2/2007  Lee et al.
2003/0229843 A1*  12/2003  Yu ................... H03M 13/1111
                                                            714/794

(Continued)

FOREIGN PATENT DOCUMENTS

| KR | 10-0502608 B1 | 7/2005 |
| KR | 10-2014-0112744 A | 9/2014 |
| KR | 10-1749096 B1 | 6/2017 |

OTHER PUBLICATIONS

G. Tzimpragos et al., "A Survey on FEC Codes for 100G and Beyond Optical Networks", IEEE Communications Surveys & Tutorials, Issue 99, pp. 1-15, Oct. 2014.

(Continued)

*Primary Examiner* — Thien Nguyen
(74) *Attorney, Agent, or Firm* — Rabin & Berdo, P.C.

(57) ABSTRACT

Provided is a low density parity check (LDPC) decoder. An LDPC decoder according to an embodiment of the inventive concept includes a variable node calculator for adding an input log-likelihood ratio (LLR) to message information of a check node to output the added values, a check node calculator for extracting signs of the output values of the variable node calculator, determining a minimum value of the output values, and calculating a correction term for the output values by using a binary logarithm to transmit to the variable node calculator, a hard decision block for determining bit values of the output values of the variable node calculator, and a parity check block for performing a parity check operation for determining validity of the bit value.

13 Claims, 6 Drawing Sheets

(52) U.S. Cl.
CPC ........... *G06F 17/13* (2013.01); *H03M 13/114* (2013.01); *H03M 13/1134* (2013.01)

(56) References Cited

U.S. PATENT DOCUMENTS

| | | | |
|---|---|---|---|
| 2006/0123318 A1* | 6/2006 | Kim | H03M 13/1114 714/758 |
| 2012/0290891 A1 | 11/2012 | Park et al. | |
| 2014/0075261 A1* | 3/2014 | Li | H03M 13/1111 714/752 |
| 2014/0281795 A1 | 9/2014 | Park et al. | |
| 2016/0055057 A1* | 2/2016 | Shin | G06F 11/1012 714/764 |
| 2017/0149446 A1* | 5/2017 | Tao | H03M 13/1117 |

OTHER PUBLICATIONS

Jinghu Chen et al., "Reduced-Complexity Decoding of LDPC Codes", IEEE Trans. On. Comm., vol. 53, No. 8, pp. 1-30, Aug. 2005.
R. G. Gallager, "Low-Density Parity-Check Codes", MIT Press, 1963.
Shahram Talakoub et al., "An improved Max-Log-MAP Algorithm for Turbo Decoding and Turbo Equalization", IEEE Trans. On Inst. and Measure., vol. 56, No. 3, pp. 1058-1063, Jun. 2007.

\* cited by examiner

LOW DENSITY PARITY CHECK DECODER USING BINARY LOGARITHM AND DECODING METHOD THEREOF

CROSS-REFERENCE TO RELATED APPLICATION

This U.S. non-provisional patent application claims priority under 35 U.S.C. § 119 of Korean Patent Application No. 10-2017-0070950, filed on Jun. 7, 2017, the entire contents of which are hereby incorporated by reference.

BACKGROUND

The present disclosure herein relates to a communication system, and more particularly, to a low density parity check (LDPC) decoder using a binary logarithm and a decoding method thereof.

An LDPC code is known as an error correction code that is closest to the Shannon limit among forward error correction techniques. Accordingly, the LDPC code has been selected as an error correction code of several communication standards such as a wireless LAN, and storage media such as a solid state drive (SSD). In addition, the LDPC code is an integral part of an optical communication system supporting a data transmission rate over 100 Gbps, or an ultrahigh-speed optical communication system, and a lot of research is underway for a real-time application.

For the LDPC code, a higher level of parallel structure is possible and speed-up is easier when compared with the Turbo code. When an LDPC decoder is implemented in hardware, several issues should be considered such as a decoding algorithm, a bit error rate (BER) performance, hardware cost, and throughput. In general, the decoding algorithm of the LDPC code is known to be difficult to implement in hardware, and to have a high implementation complexity.

What is most widely used among decoding algorithms of the LDPC code is a sum-product algorithm (SPA). For the convenience of description about the SPA, a binary phase-shift keying (BPSK) modulation scheme and an additive white Gaussian noise (AWGN) channel model are assumed.

The SPA is a soft-decision message-passing algorithm, and uses a log-likelihood ratio (LLR) of a probability value as a message value. A probability of inputted bits is called an a priori probability for received bits. The a priori probability is known before an LDPC decoder is in operation, and a probability of bits transmitted after having been calculated in the LDPC decoder is called an a posteriori probability (APP). In the SPA, probabilities are expressed in an LLR. When, like this, a probability value is expressed in a logarithmic domain, a multiplication operation may be performed as an addition operation, and thus a computational complexity may be reduced.

The core of the LDPC decoding algorithm is a check node update process. For a check node update, hyperbolic functions (e.g. tanh function) of inputted LLR's are taken and then multiplied together. The check node update is performed in a method in which an inverse function of a hyperbolic function is taken for the result of the multiplication. A check node update operation is not easy to implement in that a multiplication of hyperbolic functions and an inverse function thereof need be solved. Accordingly, various methods are being studied which can process the check node update operation more easily. One of the methods is to use tangent rule and Jacobian approach.

However, there is still a need for a technology of implementing, in hardware, a highly reliable LDPC decoding algorithm for meeting the needs of various fields.

SUMMARY

The present disclosure provides an algorithm that enables simpler and more precise hardware implementation when a low density parity check (LDPC) decoding algorithm is implemented by using Jacobian algorithm in an LDPC decoder.

In addition, the present disclosure also provides an LDPC decoder, implementing the Jacobian algorithm, which is simple in structure and has a high accuracy with low cost.

An embodiment of the inventive concept provides an LDPC decoder including: a variable node calculator configured to add an input log-likelihood ratio (LLR) to message information of a check node so as to output the added values; a check node calculator configured to extract a signs of the output values of the variable node calculator, determine a minimum value of the output values, and calculate a correction term for the output values by using a binary logarithm so as to transmit to the variable node calculator; a hard decision block configured to determine bit values of the output values of the variable node calculator; and a parity check block configured to perform a parity check operation for determining validity of the bit value.

An embodiment of the inventive concept provides a method of decoding a low density parity check (LDPC) code, the method including: multiplying a log-likelihood ratio (LLR) of an inputted bit value by a constant $\log_2 e$ (e is the natural constant.) so as to initialize the LLR; iteratively updating a check node and a variable node by using the initialized LLR; and detecting an error of a bit value of the variable node through a parity check operation, wherein the iteratively updating of the check node and the variable node stops in the case that there is no error in the bit value of the variable node.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION

Hereinafter, embodiments of the inventive concept are described in more detail with reference to the accompanying drawings. In the following description, specific details such as detailed configurations and structures are described to provide more general understandings of the embodiments of the inventive concept. Therefore, various changes and modifications to the embodiments of the inventive concept can be made by those skilled in the art within the spirit and scope of the inventive concept. Additionally, descriptions of well-known functions and structures are omitted for clarity and brevity. The terms used in the following description are defined in consideration of the functions of the inventive concept, and can vary depending on users, intentions of the users, or consumers. Thus, the definition of the terms can be determined on the basis of the detailed description.

Hereinafter, a term 'binary logarithm' is used. A binary logarithm means a logarithm to the base two. In contrast, a natural logarithm means a logarithm to the base the natural constant ('e').

Figure 1:
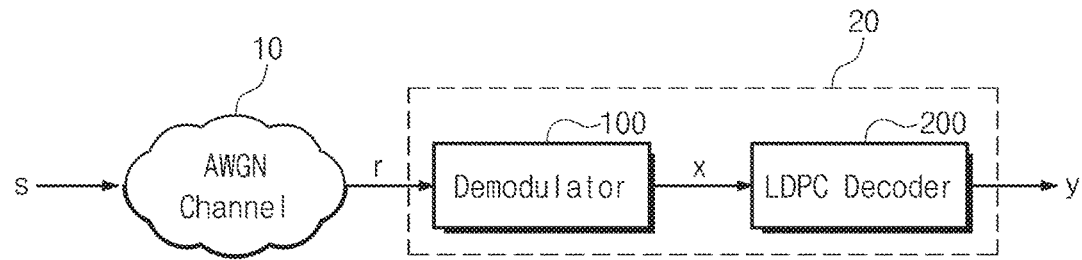
FIG. 1 is a block diagram illustrating, by way of example, a receiver including a low density parity check (LDPC) decoder according to an embodiment of the inventive concept.

FIG. 1 is a block diagram illustrating, by way of example, a receiver including a low density parity check (LDPC) decoder according to an embodiment of the inventive concept. Referring to FIG. 1, a receiver 20 of an embodiment of the inventive concept may include a demodulator 100 for demodulating a receive signal r to a receive symbol x, and an LDPC decoder 200 for performing an error correction operation for the receive symbol x.

A transmit signal s may be channel-encoded in an LDPC code scheme so as to be transmitted. The transmitted transmit signal s passes through an additive white Gaussian noise (AWGN) channel 10. The transmit signal s may be affected by an AWGN or fading in the AWGN channel 10.

A demodulator 100 processes the receive signal r so as to demodulate the receive signal r to the receive symbol x. After that, channel decoding of the receive symbol x is performed by the LDPC decoder 200 according to an embodiment of the inventive concept. The LDPC decoder 200 calculates a log-likelihood ratio (LLR) of the receive symbol x. For example, the LDPC decoder 200 may generate an LLR value corresponding to two bits from one symbol. The LDPC decoder 200 performs LDPC decoding by using the generated LLR value so as to output a determined value y.

The LDPC decoder 200 may perform an LDPC decoding of an iterative decoding method by using the LLR of the receive symbol x being inputted. For example, the LDPC decoder 200 may process the LLR according to a min-sum algorithm (MSA). The LDPC decoder 200 according to an embodiment of the inventive concept may use, instead of the natural logarithm, the binary logarithm that is the base-two logarithm, in a check node update operation.

The receiver 20 including the LDPC decoder 200, described above, according to an embodiment of the inventive concept may perform an accurate LDPC decoding operation with a simple shifter and a look-up table only. Additionally, because a decoding algorithm free from performance degradation and less complex is used, the LDPC decoder 200 may be implemented in highly reliable hardware with low cost.

Figure 2:
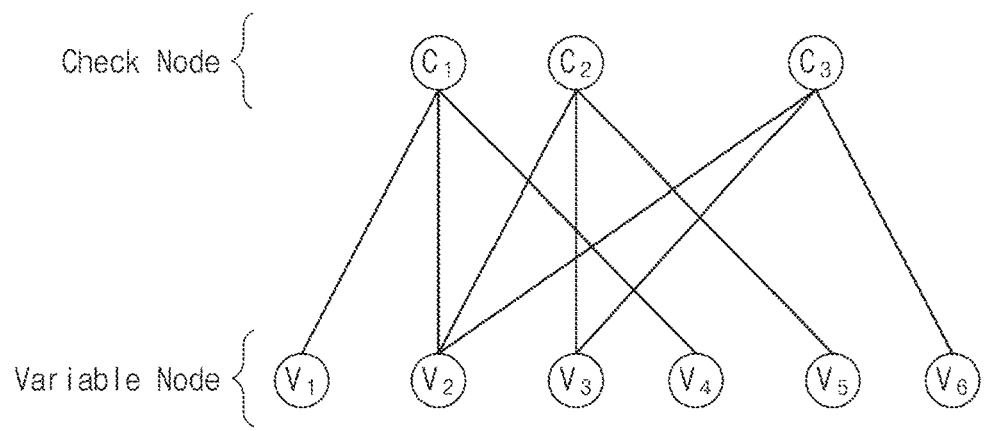
FIG. 2 is Tanner graph showing, by way of example, an LDPC code used in an embodiment of the inventive concept.

FIG. 2 is Tanner graph showing, by way of example, an LDPC code used in an embodiment of the inventive concept. Referring to FIG. 2, a node structure of the LDPC code will be briefly described.

To describe the LDPC code, a code C composed of six elements is defined to be a matrix of Equation 1 below.

$$C = [c_1 c_2 c_3 c_4 c_5 c_6]$$  [Equation 1]

The code C is assumed to satisfy three parity check equations of Equation 2.

$$c_1 \oplus c_2 \oplus c_4 = 0$$

$$c_2 \oplus c_3 \oplus c_5 = 0$$

$$c_1 \oplus c_2 \oplus c_3 \oplus c_6 = 0$$  [Equation 2]

Here, an operator $\oplus$ performed between elements corresponds to exclusive OR (XOR). Equation 2 may be expressed as Equation 3 when expressed as a determinant.

$$\begin{bmatrix} 1 & 1 & 0 & 1 & 0 & 0 \\ 0 & 1 & 1 & 0 & 1 & 0 \\ 1 & 1 & 1 & 0 & 0 & 1 \end{bmatrix} \begin{bmatrix} c_1 \\ c_2 \\ c_3 \\ c_4 \\ c_4 \\ c_6 \end{bmatrix} = \begin{bmatrix} 0 \\ 0 \\ 0 \end{bmatrix}$$  [Equation 3]

A Tanner graph corresponding to Equation 3 may be illustrated as in FIG. 2. Nodes C1, C2 and C3 located in the upper portion are called check nodes CN. The check nodes represent parity check. Nodes V1 to V6 located in the lower portion are called bit nodes or variable nodes VN representing inputted bit values.

Equation 3 may be expressed in brief by Equation 4.

$$HC^T = 0$$  [Equation 4]

Here, H is a parity check matrix, and $C^T$ is the transpose matrix of the code C. Equation 4 corresponds to a syndrome equation. In other words, when the syndrome equals zero, the code C may be a valid codeword.

The most widely used algorithm among various decoding algorithms of the LDPC code is a sum-product algorithm (SPA) called a message-passing algorithm. For a brief description of the SPA, a binary phase-shift keying (BPSK) modulation scheme and an additive white Gaussian noise (AWGN) channel model are assumed.

Because the SPA is a soft decision scheme, the SPA may express stochastic information of a transmitted signal along with information of channel. In other words, the SPA is a message-passing algorithm, and thus has higher reliability and stability of information than a decoding algorithm of hard decision scheme indicating only the sign of message.

The SPA aims at calculating an a posteriori probability of each sign. To this end, the SPA may obtain an approximate a posteriori probability through iterative calculation. The SPA uses, as a value of message, an LLR that is a probability value.

A probability of inputted bits is called an a priori probability for received bits. The a priori probability is known before the LDPC decoder 200 (see FIG. 1.) is in operation. After that, an a posteriori probability of the inputted bits will be calculated in the LDPC decoder 200 on the basis of the a priori probability.

On the AWGN channel, the SPA of a binary code may be performed more efficiently in a logarithmic domain. For calculation in the logarithmic domain, probability values are expressed as an LLR. When the probability values are expressed in the logarithmic domain, a multiplication operation may be converted to and performed as an addition operation, thereby resulting in a reduced amount of calculation. For example, an LLR L(x) may be expressed as Equation 5 below.

$$L(x) = \log\left(\frac{p(x=0)}{p(x=1)}\right) \quad \text{[Equation 5]}$$

Here, p(x=1) represents a conditional probability that a bit value x is one on a given condition, and p(x=0) represents a conditional probability that the bit value x is zero on the given condition. The sign of L(x) representing an LLR indicates a result of hard decision of the bit value x, and the magnitude of L(x) indicates the reliability of the decision.

The SPA is known as an optimal algorithm applicable to codes represented by a cycle-free Tanner graph. It is because, when the SPA is applied to cycle-free codes, the SPA is identical to a maximum a posteriori (MAP) algorithm. However, a cycle is present for a general LDPC decoding, and the SPA may provide a near-optimal decoding performance when decoding an LDPC code having a cycle.

The SPA may be divided into four steps. The four steps include an initialization step, a check node update step, a decision and parity check step, and a variable node update step.

First, an a priori probability is assigned to each variable node in the initialization step. That is, each variable node may be initialized to an LLR of Equation 6 below.

$$L(x_n \mid y_n) = \log\frac{Pr(x_n = 0 \mid y_n)}{Pr(x_n = 1 \mid y_n)} = \frac{2}{\sigma^2} y_n \quad \text{[Equation 6]}$$

Here, $L(x_n|y_n)$ means an LLR of an a priori probability for a bit value $x_n$ inputted on the condition of $y_n$. $Pr(x_n=1|y_n)$ is a conditional probability that the bit value $x_n$ is equal to one on the condition of $y_n$, and $Pr(x_n=0|y_n)$ is a conditional probability that the bit value $x_n$ is equal to zero on the condition of $y_n$. $\sigma^2$ represents a variance of noise of the AWGN channel.

In the following check node update step, all messages connected to each check node are collected. That is, the check node collects information from all connected variable nodes, and updates the reliability of a bit. The check node update may be summarized by Equation 7 below.

$$L_{m \to n}(x_n) = 2 \tanh^{-1}\left[\prod_{n' \in N(m)\setminus n} \tanh\frac{Z_{n' \to m}(x_{n'})}{2}\right] \quad \text{[Equation 7]}$$

Here, $L_{m \to n}(x_n)$ represents an LLR of a message value of an nth check node by an mth variable node.

The following decision and parity check step may be performed with reference to Equation 8 below.

$$Z_n(x_n) = \sum_{m \in M(n)} L_{m \to n}(x_n) + L(x_n \mid y_n) \xrightarrow{H/D} x_i = \quad \text{[Equation 8]}$$

$$\begin{cases} 1, & Z_n(x_n) < 0 \\ 0, & Z_n(x_n) \geq 0 \end{cases}, Hx^T = 0$$

That is, an a posteriori probability $Z_n(x_n)$ of received bit value $x_n$ is determined, and the sign thereof is determined by hard decision. Additionally, a parity check operation will be performed by a parity check matrix H.

In addition, in the variable node update step, message values of a variable node will be updated for all n by Equation 9 below.

$$Z_{n \to m}(x_n) = \sum_{m' \in M(n)\setminus m} L_{m' \to n}(x_n) + L(x_n \mid y_n) \quad \text{[Equation 9]}$$

The processes of the check node update, the decision and parity check, and the variable node update described above are iterated until $Hx^T=0$ is satisfied.

The core of an LDPC decoding algorithm is the check node update process of Equation 7 described above. An algorithm about the check node update process is constructed in a method in which a tanh function, a hyperbolic function, is taken for the inputted LLR, and an inverse function of the tanh function is taken for the multiplication of the results thereof. This process is difficult to implement because a product of hyperbolic functions and an inverse function of the result thereof need be solved. One of various methods for easy calculation is to use tangent rule and Jacobian approach. Equation 10 below shows the Jacobian approach.

[Equation 10]
$$\begin{aligned} L(x_1 \oplus x_2) &= \log\frac{1 + e^{(L(x_1)+L(x_2))}}{e^{L(x_1)} + e^{L(x_2)}} \\ &= \text{sgn}(L(x_1)) \cdot \text{sgn}(L(x_2)) \cdot \min(|L(x_1)|, |L(x_2)|) + \\ &\quad \log\{1 + e^{-|L(x_1)+L(x_2)|}\} - \log\{1 + e^{-|L(x_1)-L(x_2)|}\} \end{aligned}$$

Here, $L(x_1)$ and $L(x_2)$ respectively represent LLR's of inputted bit values $x_1$ and $x_2$. sgn(·) is a function representing a sign, and min(·) is a function representing a minimum value. Here, logarithmic functions are a correction term using a natural logarithm that uses the natural constant e as the base.

In Equation 10 described above, a tanh function is replaced by an exponential function, and thus, Equation 10 is the same as an original equation from the viewpoint of algorithm. Accordingly, there occurs no degradation of decoding performance in the LDPC decoder. However, when Equation 10 is actually implemented in hardware, it is difficult to accurately calculate the logarithmic terms. Accordingly, the correction term is usually implemented by using a look-up table. Here, Equation 10 described above is a case of two inputs. Accordingly, in order to calculate LLR's for all inputs, an iterative operation should be performed as in FIG. 3.

Figure 3:
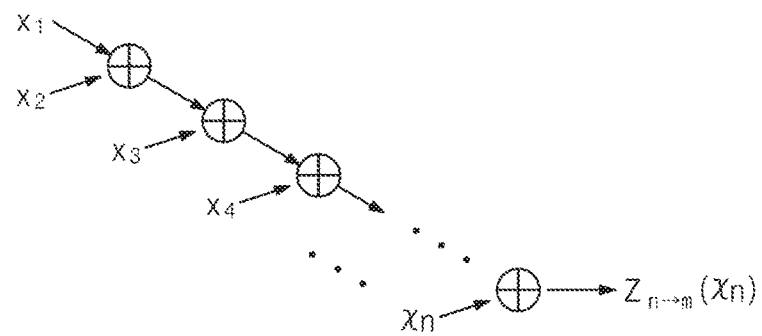
FIG. 3 illustrates an iterative operation of Jacobian approach.

FIG. 3 illustrates an iterative operation of Jacobian approach. Referring to FIG. 3, illustrated is a method of calculating an LLR of $L_{m \to n}(x_n)$ in the Jacobian approach for reducing the calculation amount of the check node update. First, performed is a Jacobian approach operation of a result of calculating LLR's of the bit values $x_1$ and $x_2$, and a bit value $x_3$. In this way, an LLR of $L_{m \to n}(x_n)$ may be calculated for all input bit value $x_n$.

An algorithm for approximating the correction term of Equation 10 is also introduced. According to this algorithm, $\log(1+e^{-x})$ may be approximated to $\log 2 - (1/2)x$ so as to reduce calculation amount. Equation 10 may be converted to Equation 11 below, by approximating the correction term.

[Equation 11]
$$L(x_1 \oplus x_2) = \log \left| \frac{1 + e^{(L(x_1)+L(x_2))}}{e^{L(x_1)} + e^{L(x_2)}} \right|$$
$$= \text{sgn}(L(x_1)) \cdot \text{sgn}(L(x_2)) \cdot \min(|L(x_1)|, |L(x_2)|) +$$
$$\max\left(0, \log 2 - \frac{1}{2}|L(x_1) + L(x_2)|\right) -$$
$$\max\left(0, \log 2 - \frac{1}{2}|L(x_1) - L(x_2)|\right)$$

In Equation 11, an algorithm of removing a logarithmic term is called the MSA. However, the MSA is known to cause a performance degradation of about 0.5 dB because the MSA is an approximation algorithm neglecting the correction term.

In an embodiment of the inventive concept, when an equation is derived for the check node update in the Jacobian approach, a binary logarithm is used which uses two as the base instead of using the natural constant e as the base. This method of deriving the equation may be expressed as in Equation 12 below.

[Equation 12]
$$L(x_1 \oplus x_2) = \log \frac{1 + 2^{(L(x_1)+L(x_2))}}{2^{L(x_1)} + 2^{L(x_2)}}$$
$$= \text{sgn}(L(x_1)) \cdot \text{sgn}(L(x_2)) \cdot \min(|L(x_1)|, |L(x_2)|) +$$
$$\log_2\{1 + 2^{-|L(x_1)+L(x_2)|}\} -$$
$$\log_2\{1 + 2^{-|L(x_1)-L(x_2)|}\}$$

Here, the relationship of Equation 13 is established between $e^x$ and $2^x$.

$$e^x = 2^{(\log_2 e)x} \qquad \text{[Equation 13]}$$

Accordingly, when each of $L(x_1)$ and $L(x_2)$ of Equation 10 is multiplied by $\log_2 e$, Equation 10 becomes the same as Equation 12. In this case, $L(x_1)$ and $L(x_2)$ are LLR's of an input of the LDPC decoder 200. Accordingly, when the input of the LDPC decoder 200 is multiplied by a constant $\log_2 e$, Equation 12 becomes the same as Equation 10 in which calculation is performed by using the natural logarithm. Accordingly, obtained is a check node update performance the same as that of the Jacobian approach which uses the natural logarithm.

Equation 12 described above considers only two inputs. Accordingly, consecutive inputs should be iteratively processed as in Equation 7 described above. Thus, a check node update operation for all input LLR's processed in a binary logarithm method may be modified to Equation 14 below.

$$L_{m \to n}(x_n) = 2_{n' \in N(m) \setminus n} Z_{n' \to m}(x_{n'}) \qquad \text{[Equation 14]}$$

While Equation 12 is an equation for processing two inputs, Equation 14 expresses a method of processing consecutive inputs on the basis of Equation 12. Two in Equation 14 indicates that a binary logarithm is used.

The whole LDPC decoding algorithm using a binary logarithm described above is as follows.

(1) Initialization $$L(x_n | y_n) = \log \frac{Pr(x_n = 0 | y_n)}{Pr(x_n = 1 | y_n)} = \frac{2}{\sigma^2} y_n \qquad \text{[Equation 15]}$$

(2) Check node update $$L_{m \to n}(x_n) = 2 \tanh^{-1} \left[ \prod_{n' \in N(m) \setminus n} \tanh \frac{Z_{n' \to m}(x_{n'})}{2} \right] \qquad \text{[Equation 16]}$$

(3) Decision and parity check $$Z_n(x_n) = \sum_{m \in M(n)} L_{m \to n}(x_n) + L(x_n | y_n) \xrightarrow{H/D} x_i = \qquad \text{[Equation 17]}$$

$$\begin{cases} 1, & Z_n(x_n) < 0 \\ 0, & Z_n(x_n) \geq 0 \end{cases}, Hx^T = 0$$

(4) Variable node update $$Z_{n \to m}(x_n) = \sum_{m' \in M(n) \setminus m} L_{m' \to n}(x_n) + L(x_n | y_n) \qquad \text{[Equation 18]}$$

Figure 4:
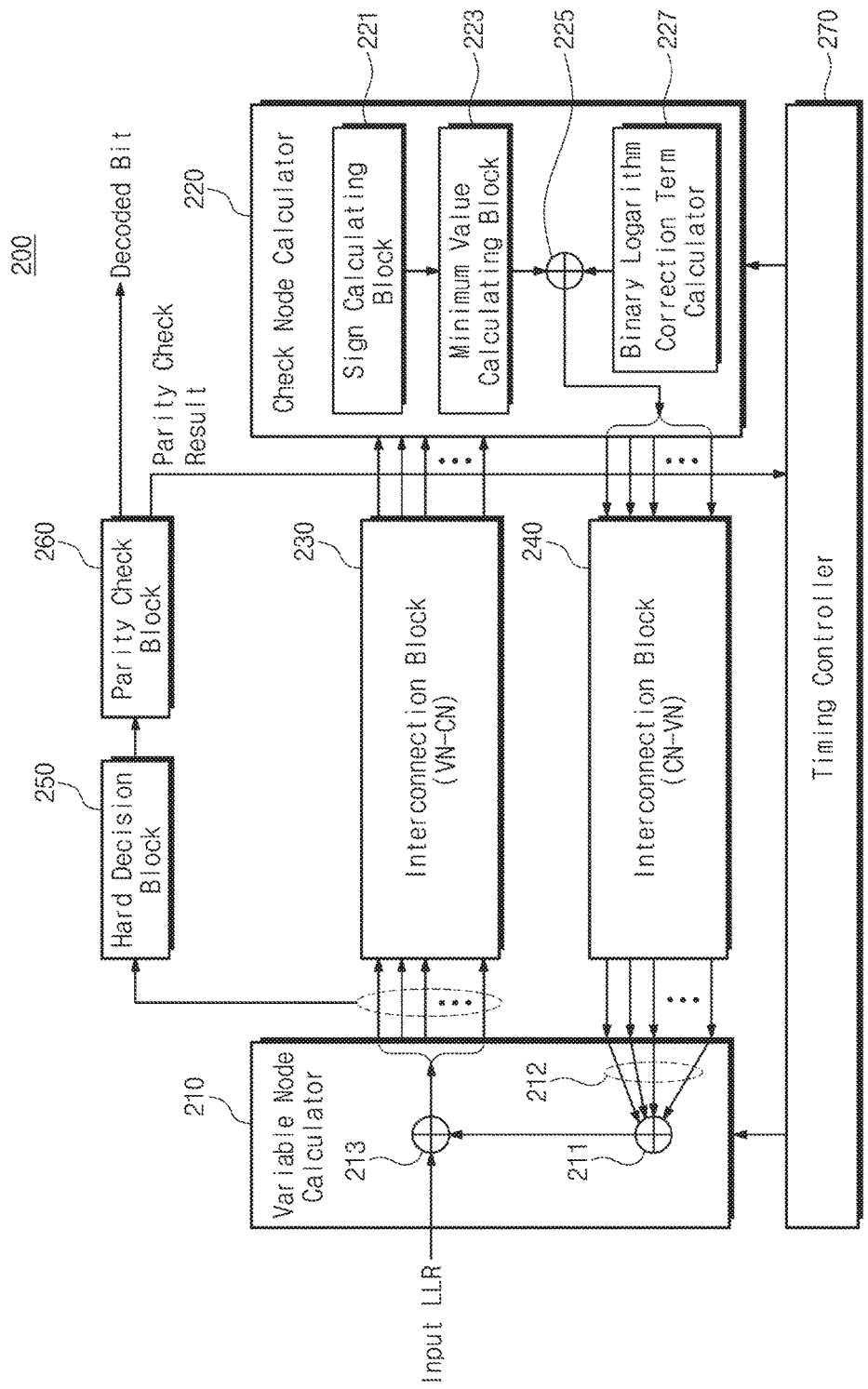
FIG. 4 is a block diagram illustrating the LDPC decoder according to an embodiment of the inventive concept.

FIG. 4 is a block diagram illustrating the LDPC decoder according to an embodiment of the inventive concept. Referring to FIG. 4, the LDPC decoder 200 applying Equations 15 to 17 thereto may include a variable node calculator 210, a check node calculator 220, interconnection blocks 230 and 240, a hard decision block 250, a parity check block 260, and a timing controller 270.

The variable node calculator 210 receives message information 212 (or probability information) from check nodes in order to transmit an initialized input LLR to a check node. At least one piece of message information 212 is added by an adder 211. The variable node calculator 210 collects the message information 212 provided from the check node, and updates an a posteriori probability (APP) of the variable node on the basis of the message information 212. The variable node calculator 210 adds, by an adder 213, an input LLR and added message information provided from the adder 211 so as to transmit to the check node calculator 220.

The variable node calculator 210 outputs the input LLR initialized by Equation 15 such that the initialized input LLR may be transmitted to the check nodes. After that, the output values of the variable node calculator 210 are transmitted to the check nodes according to an interconnection relationship (VN-CN) determined by a parity check matrix. The interconnection relationship from a variable node to a check node is defined by an interconnection block (VN-CN) 230 configured by the parity check matrix.

The check node calculator 220 may extract a sign, obtain a minimum value, and calculate a correction term by using a binary logarithm, by using the output values of the variable node transmitted by the interconnection block (VN-CN) 230. The check node calculator 220 may include, for the operation described above, a sign calculating block 221, a minimum value calculating block 223, an adder 225, and a binary logarithm correction term calculator 227.

The sign calculating block 221 calculates the signs of the output values of the variable node transmitted through the interconnection block (VN-CN) 230. The minimum value calculating block 223 calculates a minimum value of the transmitted output values of the variable node. The binary logarithm correction term calculator 227 calculates a correction term of a binary logarithm form of Equation 12. When the sign calculation, the minimum value calculation, and the correction term calculation end for output values of all variable nodes, the check node calculator 220 adds results thereof by the adder 225 so as to transmit to the variable node calculator 210 according to an interconnection relationship of an interconnection block (CN-VN) 240. After that, the variable node calculator 210 performs an iterative operation that an input LLR and the transmitted output value of the check node are added again so as to be transmitted to the check node calculator 220.

The hard decision block 250 determines a bit value from the output value of the variable node calculator 210. The parity check block 260 performs a parity check operation for the bit value determined by the hard decision block 250. When the syndrome is determined to be zero by the parity check block 260, the bit values inputted to the hard decision block 250 are determined to be a valid codeword, and are outputted as decoded bits. Additionally, a parity check result is transmitted to the timing controller 270. The timing controller 270 performs control, in the case that the parity check result meets criteria, of the variable node calculator 210 and the check node calculator 220 such that an iterative operation for the update of the check node and the variable node stops.

Figure 5:
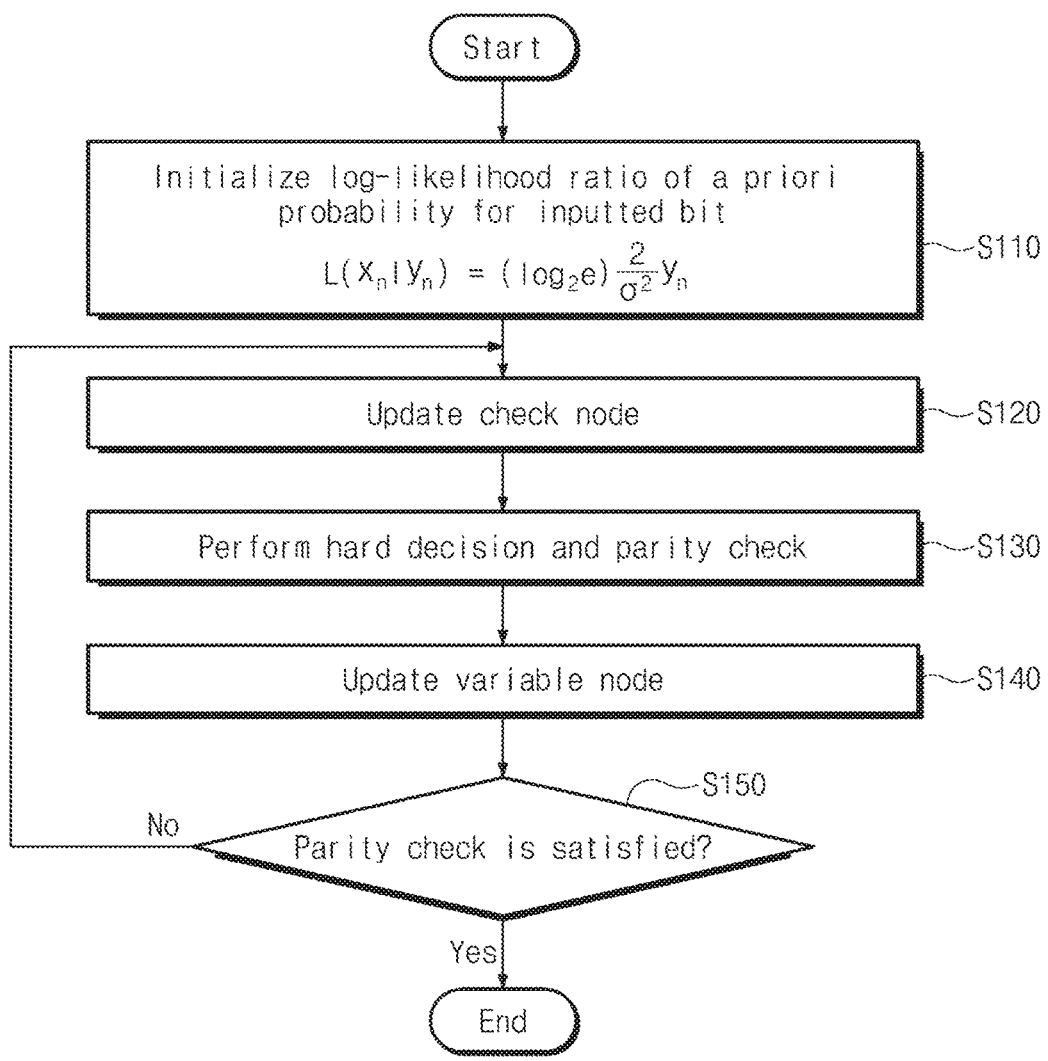
FIG. 5 is a flow chart illustrating the operation of the LDPC decoder according to an embodiment of the inventive concept.

FIG. 5 is a flow chart briefly illustrating the operation of a low density parity check (LDPC) decoder according to an embodiment of the inventive concept. Referring to FIG. 5, an LDPC decoder 200 may update a check node by using a binary logarithm.

In step S110, the LDPC decoder 200 initializes messages of a variable node. For example, $L(x_n|y_n)$ is initialized which means a log-likelihood ratio (LLR) of an a priori probability of a bit value $x_n$ inputted on the condition of $y_n$. In this case, LLR's of all inputted bit values are multiplied by $\log_2 e$ using two as the base.

In step S120, the LDPC decoder 200 performs a check node update operation. In particular, a binary logarithm for an input LLR is applied to a Jacobian approach operation for a check node update. For the check node update, a variable node calculator 210 (see FIG. 4.) outputs the input LLR initialized by Equation 15 such that the initialized input LLR may be transmitted to check nodes. The output values of the variable node calculator 210 are transmitted to the check nodes according to an interconnection relationship from variable nodes to the check nodes. The interconnection relationship from the variable nodes to the check nodes is defined by an interconnection block (VN-CN) 230 configured by a parity check matrix.

In step S130, a hard decision block 250 determines a bit value from output values of the variable node calculator 210. A parity check block 260 performs a parity check operation for the bit value determined by the hard decision block 250. In this case, an output of the parity check block 260 is also transmitted to a timing controller 270, and is used to determine whether to continue an iterative operation.

In step S140, a variable node update operation is performed. In this step, message values of the variable node for all input values are updated according to Equation 18.

In step S150, the timing controller 270 determines whether to continue the node update operation depending on a parity check result provided from the parity check block 260. In other words, the timing controller 270 determines whether to continue the iterative operation of the check node update and the variable node update depending on whether the result of the parity check operation satisfies $Hx^T=0$. In the case that the result of the parity check operation satisfies $Hx^T=0$ (Yes direction), the iterative operation of the check node update and the variable node update ends. However, in the case that the result of the parity check operation does not satisfy $Hx^T=0$ (No direction), process returns to step S120.

In the foregoing description, briefly described is the operation of the LDPC decoder 200 according to an embodiment of the inventive concept. In the case that the check node update operation is performed using a binary logarithm using two as the base, a decoding of an LDPC code is possible which enables a simplified algorithm even without a performance difference with the case of using the natural logarithm.

Figure 6:
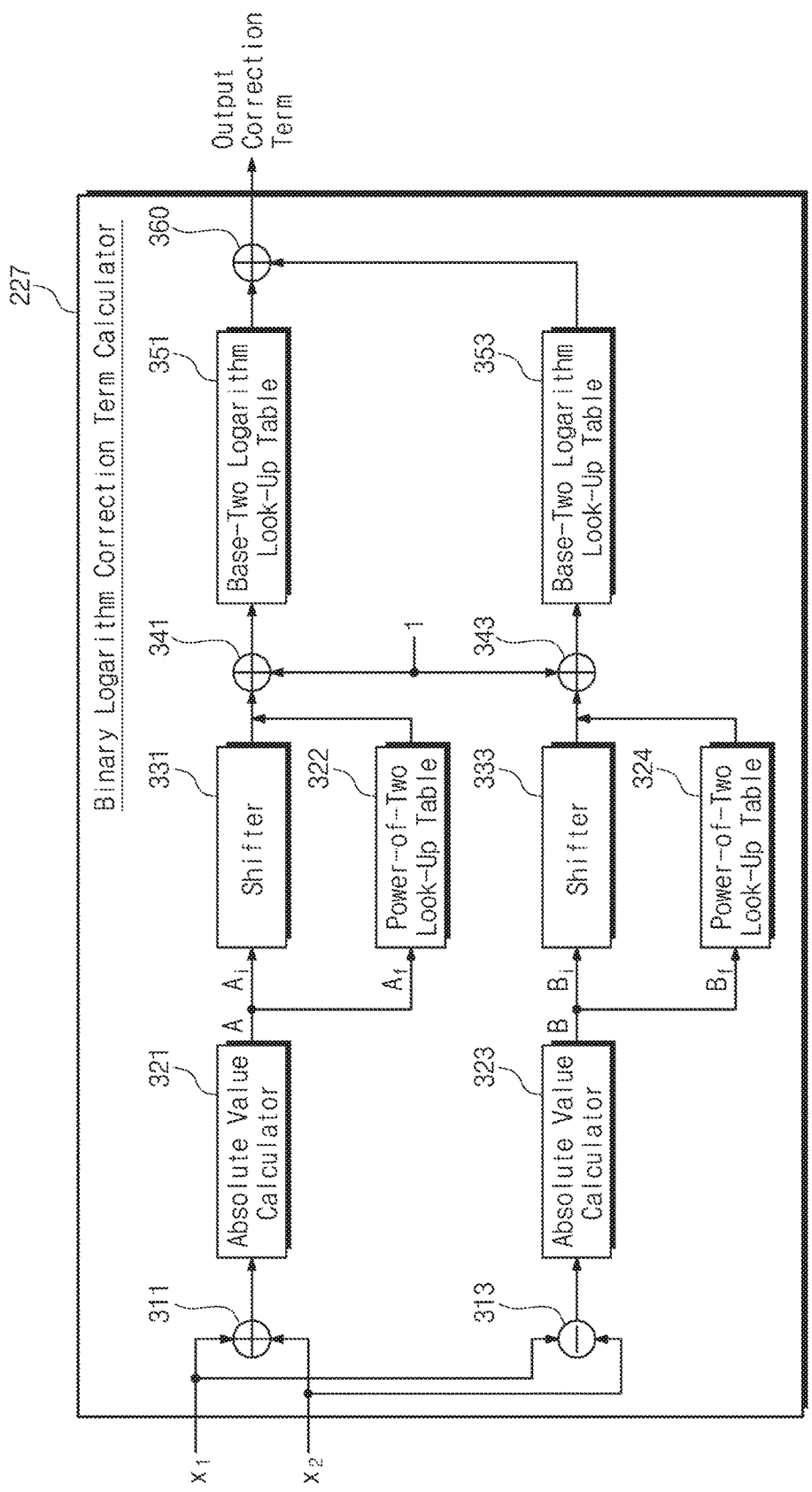
FIG. 6 is a block diagram illustrating a configuration of a binary logarithm correction term calculator of FIG. 4.

FIG. 6 is a block diagram illustrating an exemplary configuration of the binary logarithm correction term calculator of FIG. 4. Referring to FIG. 6, the binary logarithm correction term calculator 227 may include absolute value calculators 321 and 323, shifters 331 and 333, power-of-two look-up tables 322 and 324, base-two logarithm look-up tables 351 and 353, adders 311, 341, 343 and 360, and a subtractor 313.

First, when LLR values $x_1$ and $x_2$ inputted to the check node calculator are inputted, the adder 311 and the subtractor 313 respectively transmit an addition result and a subtraction result of the inputted LLR values $x_1$ and $x_2$ to the absolute value calculators 321 and 323. The absolute value calculator 321 calculates an absolute value A of the addition result of the LLR values $x_1$ and $x_2$. Additionally, the absolute value calculator 323 calculates an absolute value B of the subtraction result of the LLR values $x_1$ and $x_2$. The absolute value A is divided into an integer part Ai and a fractional part Af, and the integer part Ai and the fractional part Af are respectively provided to the shifter 331 and the power-of-two look-up table 322. Additionally, the absolute value B is also divided into an integer part Bi and a fractional part Bf, and the integer part Bi and the fractional part Bf are respectively provided to the shifter 333 and the power-of-two look-up table 324.

Accordingly, when $2^A$ is divided into $2^{Ai}2^{Af}$, $2^{Ai}$ having an integer exponent may be implemented by the shifter 331, and $2^{Af}$ having a decimal exponent may be implemented by a smaller exponent value part of the power-of-two look-up table 322. The adder 341 adds one to a result calculated through this division. A result thereof is provided to the base-two logarithm look-up table 351, and a part of a correction term is calculated. Additionally, when $2^B$ is divided into $2^{Bi}2^{Bf}$, $2^{Bi}$ having an integer exponent may be implemented by the shifter 333, and $2^{Bf}$ having a decimal exponent may be implemented by a smaller exponent value part of the power-of-two look-up table 324. The adder 343 adds one to a result calculated through this division, and a result thereof is provided to the base-two logarithm look-up table 353 so as to obtain a binary logarithm value. When the outputs of the base-two logarithm look-up tables 351 and 353 are added by the adder 360, the correction term using a binary logarithm is generated.

When the binary logarithm correction term calculator is implemented in this way, a more accurate calculation is possible than the case of implementing a whole binary logarithm term as a look-up table, and a binary logarithm correction term calculator may be implemented by using a simple shifter and a look-up table.

Figure 7:
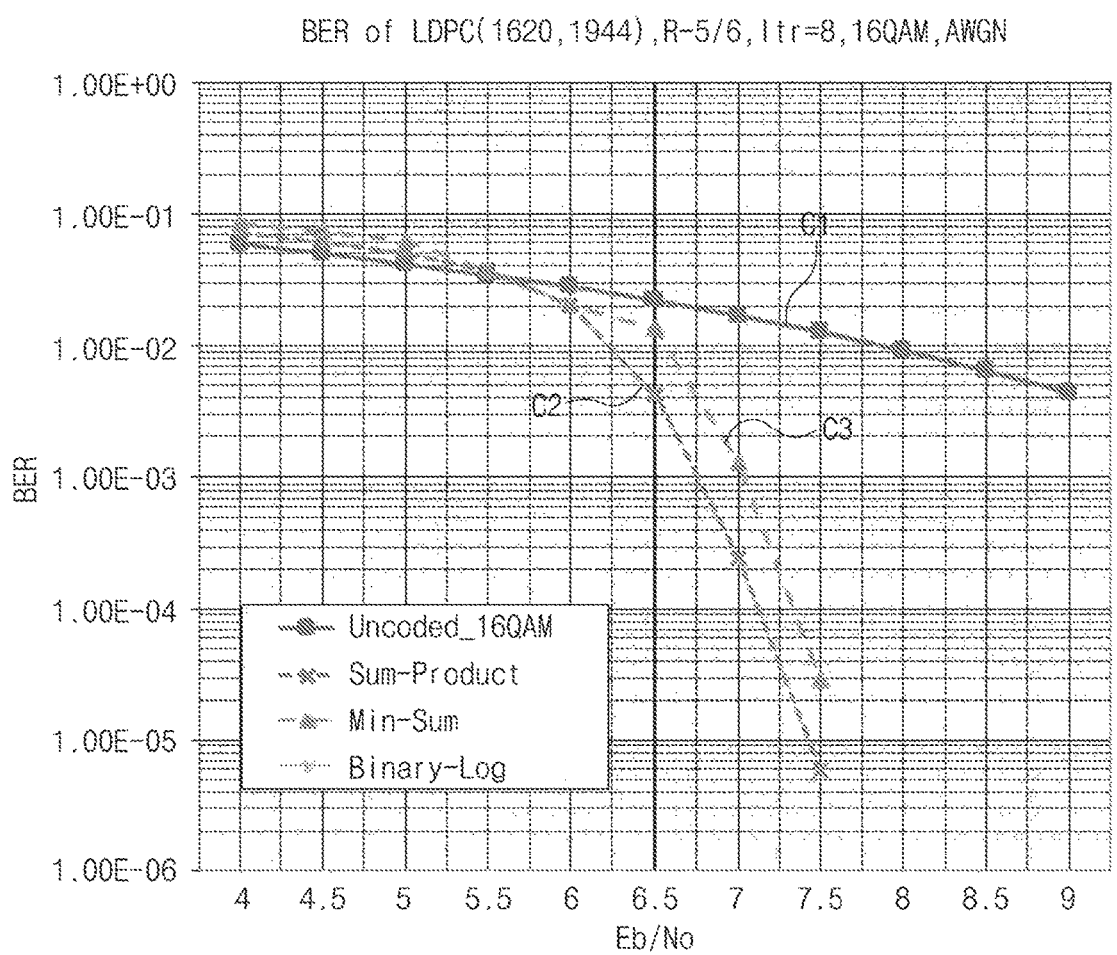
FIG. 7 is a block diagram illustrating an approximate configuration of the binary logarithm correction term calculator of FIG. 6.

FIG. 7 is a block diagram illustrating an approximate configuration of the binary logarithm correction term calculator of FIG. 6. Referring to FIG. 7, a logarithmic term may be approximated to improve the calculation speed of the binary logarithm correction term calculator 227 of FIG. 6.

The correction terms expressed in logarithm of Equation 12 may be expressed as in Equation 19 below.

$$\left.\begin{array}{l}\log\{1+2^{-|L(x_1)+L(x_2)|}\}\\ \log\{1+2^{-|L(x_1)-L(x_2)|}\}\end{array}\right\} \rightarrow \log\{1+2^{-|x|}\} \quad \text{[Equation 19]}$$

Two logarithmic terms are each in the form of log $\{1+2^{-|x|}\}$. This form of logarithmic term may be expanded in MacLaurin series as in Equation 20. When only two dominant terms are taken from the expanded terms, the logarithmic term is approximated as $1-x/2$.

$$\log_2(1+2^{-x}) = 1 - \frac{1}{2}x + \frac{\ln 2}{4}x^2 + \cdots \approx 1 - \frac{1}{2}x \quad \text{[Equation 20]}$$

Using the relationship described above, Equation 12 may be approximated into Equation 21 below.

$$\begin{aligned}L(x_1 \oplus x_2) &= \log\frac{1+2^{(L(x_1)+L(x_2))}}{2^{L(x_1)}+2^{L(x_2)}} \quad \text{[Equation 21]}\\ &= \text{sgn}(L(x_1))\cdot\text{sgn}(L(x_2))\cdot\min(|L(x_1)|, |L(x_2)|) +\\ &\quad \max\left(0, 1-\frac{1}{2}|L(x_1)+L(x_2)|\right) -\\ &\quad \max\left(0, 1-\frac{1}{2}|L(x_1)-L(x_2)|\right)\end{aligned}$$

Briefly illustrated in FIG. 7 is a binary logarithm correction term calculator 227' for calculating an approximated correction term of Equation 21. The approximated binary logarithm correction term calculator 227' may include shifters 431 and 433, comparators 451 and 453, adders 411 and 460, and subtractors 413, 441 and 443.

First, when LLR values $x_1$ and $x_2$ are inputted, the inputted LLR values $x_1$ and $x_2$ are added by the adder 411, and transmitted to the shifter 431. Additionally, the inputted LLR values $x_1$ and $x_2$ are subtracted by the subtractor 413, and transmitted to the shifter 433.

The shifters 431 and 433 respectively shift outputs of the adder 411 and the subtractor 413 by one bit to the right. An operation of shifting bits by one bit to the right has an effect of multiplying by ½. Practically, implementation is possible by wiring only, without using the shifters 431 and 433. The subtractors 441 and 443 respectively subtract outputs of the shifters 431 and 433 from one.

The comparators 451 and 453 respectively compare outputs of the subtractors 441 and 443 with zero. Outputs of the comparators 451 and 453 are added by the adder 460, and then the result is outputted as an output correction term. In a general approximation equation, a constant $\log_e 2$ (or, $\ln 2$) is required, and an approximation process has been further required to process the constant $\log_e 2$. In contrast, when a binary logarithm is used, a constant provided to the subtractors 441 and 443 is one, and thus a more accurate operation is enabled.

Figure 8:
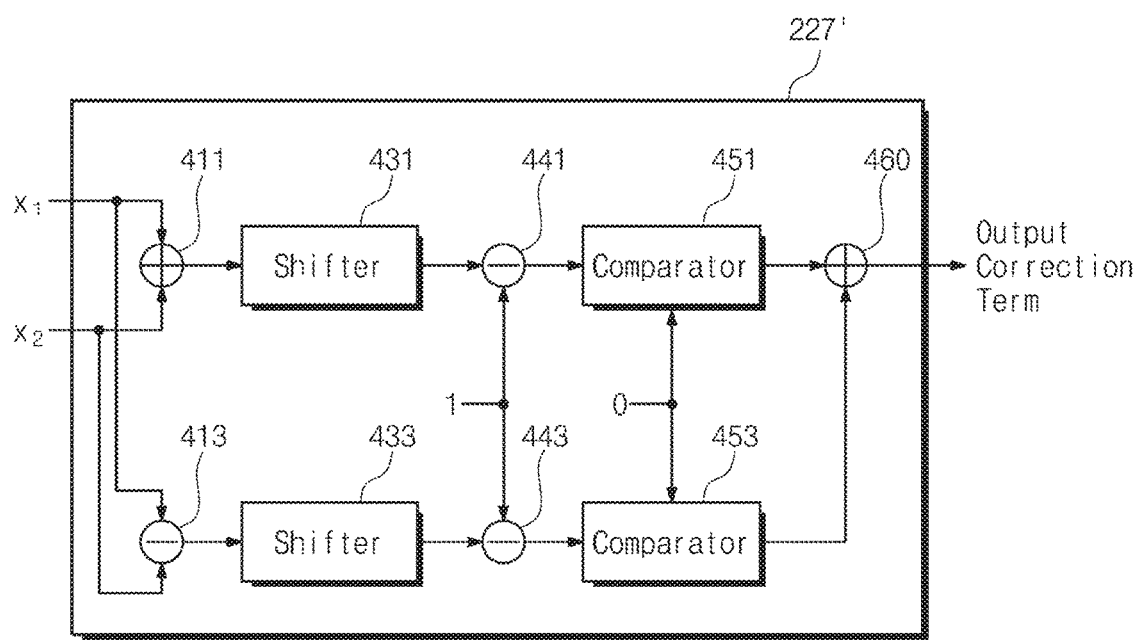
FIG. 8 is a graph showing a bit error rate (BER) performance of an LDPC decoding algorithm according to an embodiment of the inventive concept.

FIG. 8 is a graph showing a BER performance of the LDPC decoding algorithm according to an embodiment of the inventive concept. FIG. 8 briefly shows simulation results of a conventional LDPC decoding algorithm using a natural logarithm and a method of an embodiment of the inventive concept using a binary logarithm at the floating-point level. The conditions of the simulation are that a code of a code rate R=5/6 is modulated by a 16-QAM scheme and iterated eight times on the AWGN channel condition.

A curve C1 shows a bit error rate (BER) in an uncoded case. A curve C2 shows a BER of the LDPC decoding algorithm using the binary logarithm according to an embodiment of the inventive concept, and the SPA using the natural logarithm. A curve C3 shows a BER of the conventional MSA LDPC decoding algorithm.

It is seen that the BER of the LDPC decoding algorithm using the binary logarithm according to an embodiment of the inventive concept is exactly the same as the BER of the SPA using the natural logarithm. In other words, it is seen that there is no performance difference between the LDPC decoding algorithm using the binary logarithm according to an embodiment of the inventive concept and the LDPC decoding algorithm of the SPA. Additionally, the LDPC decoder according to an embodiment of the inventive concept may be implemented in a simple configuration by using the binary logarithm.

According to a configuration of an embodiment of the inventive concept, an LDPC decoder using the base-two binary logarithm may be easily implemented. Accordingly, an LDPC decoder which is easily implemented in hardware and has less performance degradation, and a method thereof may be provided. When the binary logarithm is used which is proposed in an embodiment of the inventive concept, an accurate calculation of a correction term is possible by using only a simple shifter and a look-up table. Additionally, an LDPC decoder may be implemented which accurately performs a high speed operation by using an approximated configuration.

Although the exemplary embodiments of the inventive concept have been described herein, it is understood that various changes and modifications can be made by those skilled in the art within the spirit and scope of the inventive concept. Therefore, the spirit and scope of the inventive concept is defined by the following claims or the equivalents other than the foregoing detailed description of the exemplary embodiments.

What is claimed is:

1. A low density parity check (LDPC) decoder comprising:
a variable node calculator configured to add an input log-likelihood ratio (LLR) to message information of a check node to generate added values and to output the added values as output values;
a check node calculator configured to calculate signs of the output values of the variable node calculator, a minimum value of the output values, and a correction term for the output values by using a binary logarithm, and to transmit a calculated result value to the variable node calculator;
a hard decision block configured to determine bit values of the output values of the variable node calculator; and
a parity check block configured to perform a parity check operation for determining validity of the bit values determined by the hard decision block.

2. The LDPC decoder of claim 1, wherein the variable node calculator multiplies the input LLR by a constant $\log_2 e$ (e is the natural constant.) to initialize the input LLR.

3. The LDPC decoder of claim 1, further comprising:
a first interconnection block configured to transmit the output values of the variable node calculator to the check node calculator according to an interconnection relationship determined by a parity check matrix; and
a second interconnection block configured to transmit the result value of the check node calculator to the variable node calculator according to an interconnection relationship determined by the parity check matrix.

4. The LDPC decoder of claim 1, wherein the check node calculator comprises:
a sign calculating block configured to calculate the signs of the output values of the variable node calculator;
a minimum value calculating block configured to determine the minimum value among absolute values of the output values of the variable node calculator; and
a binary logarithm correction term calculator configured to calculate the correction term.

5. The LDPC decoder of claim 4, wherein the binary logarithm correction term calculator comprises:
a first absolute value calculator configured to calculate a first absolute value of a sum of a first LLR and a second LLR;
a second absolute value calculator configured to calculate a second absolute value of a subtraction value between the first LLR and the second LLR;
a first shifter configured to shift an integer part of the first absolute value to convert the integer part to a power of two;
a first power look-up table configured to convert a fractional part of the first absolute value to a power of two;
a second shifter configured to shift an integer part of the second absolute value to convert the integer part to a power of two;
a second power look-up table configured to convert a fractional part of the second absolute value to a power of two;
a first adder configured to add one to an output of the first shifter and the first power look-up table;
a second adder configured to add one to an output of the second shifter and the second power look-up table;
a first base-two look-up table configured to obtain a binary logarithm value of an output of the first adder;
a second base-two look-up table configured to obtain a binary logarithm value of an output of the second adder; and
a third adder configured to add values outputted from the first base-two look-up table and the second base-two look-up table to output the added values as the correction term.

6. The LDPC decoder of claim 4, wherein the binary logarithm correction term calculator comprises:
a first shifter configured to shift the sum of a first LLR and a second LLR by one bit to the right;
a second shifter configured to shift the subtraction value between the first LLR and the second LLR by one bit to the right;
a first comparator configured to compare, with zero, a value obtained by subtracting an output of the first shifter from one;
a second comparator configured to compare, with zero, a value obtained by subtracting an output of the second shifter from one; and
an adder configured to add results of the first comparator and the second comparator and output the added results as the correction term.

7. The LDPC decoder of claim 6, wherein the first shifter and the second shifter comprise a wiring structure.

8. The LDPC decoder of claim 1, further comprising a timing controller configured to determine whether the variable node calculator and the check node calculator perform iterative operations respectively for updates of a check node and a variable node, on the basis of a result of the parity check operation performed in the parity check block.

9. The LDPC decoder of claim 1, wherein the check node calculator processes the output values of the variable node calculator by using a Jacobian approach.

10. A method of decoding a low density parity check (LDPC) code, the method comprising:
multiplying a log-likelihood ratio (LLR) of an inputted bit value by a constant $\log_2 e$ (e is the natural constant.) to initialize the LLR;
iteratively updating a check node and a variable node by using the initialized LLR, wherein the updating of the check node comprises processing the LLR by using a binary logarithm; and
detecting an error of a bit value of the variable node through a parity check operation,
wherein the iteratively updating of the check node and the variable node stops when there is no error in the bit value of the variable node.

11. The method of claim 10, wherein the iteratively updating of the check node and the variable node comprises:
updating the check node by using the LLR; and
receiving a value of the updated check node to update the variable node.

12. The method of claim 10, further comprising determining the bit value of the variable node according to a hard decision operation.

13. The method of claim 10, further comprising outputting the bit value of the variable node as a decoded bit when no error is detected in the parity check operation.

* * * * *